(12) United States Patent
Kim et al.

(10) Patent No.: US 12,457,858 B2
(45) Date of Patent: Oct. 28, 2025

(54) DISPLAY DEVICE

(71) Applicant: Samsung Display Co., LTD., Yongin-si (KR)

(72) Inventors: Yeong Ho Kim, Asan-si (KR); So Ra Kwon, Seoul (KR); Hongyoub Na, Hwaseong-si (KR); Jung Wook Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 504 days.

(21) Appl. No.: 18/056,569

(22) Filed: Nov. 17, 2022

(65) Prior Publication Data

US 2023/0301140 A1    Sep. 21, 2023

(30) Foreign Application Priority Data

Mar. 15, 2022  (KR) .......................... 10-2022-0032327

(51) Int. Cl.
*H10K 59/122*    (2023.01)
*H10K 59/123*    (2023.01)
*H10K 59/131*    (2023.01)

(52) U.S. Cl.
CPC ......... *H10K 59/122* (2023.02); *H10K 59/123* (2023.02); *H10K 59/131* (2023.02)

(58) Field of Classification Search
None
See application file for complete search history.

(56) References Cited

U.S. PATENT DOCUMENTS

| 2015/0168788 A1* | 6/2015 | Song ...................... G02F 1/1368 345/174 |
| 2016/0132148 A1* | 5/2016 | Han ........................ G06F 3/0412 345/174 |
| 2017/0040347 A1* | 2/2017 | Seo ..................... H10K 59/8722 |
| 2018/0203555 A1* | 7/2018 | Miyamoto ............ G06F 3/0445 |
| 2019/0006442 A1* | 1/2019 | Byun .................... H10K 59/131 |
| 2019/0237533 A1* | 8/2019 | Kim ....................... G09G 3/3275 |
| 2021/0376291 A1  | 12/2021 | Park et al. |
| 2022/0199732 A1* | 6/2022 | Seo ....................... H10K 59/126 |
| 2023/0138392 A1* | 5/2023 | Shin .................... H10K 59/8723 257/40 |

(Continued)

FOREIGN PATENT DOCUMENTS

| CN | 104241324 B  * | 8/2017  | ........... G02F 1/1506 |
| CN | 220342751 U  * | 1/2024  | ........... H10K 59/122 |

(Continued)

*Primary Examiner* — Michael Lebentritt
(74) *Attorney, Agent, or Firm* — Womble Bond Dickinson (US) LLP

(57) ABSTRACT

A display device includes: a substrate having a display area and a peripheral area at a side of the display area; a transistor in the display area of the substrate; a first electrode connected to the transistor; a pixel defining layer on the first electrode and having a plurality of pixel openings; an emission layer in respective ones of the pixel openings; a second electrode on the emission layer and the pixel defining layer; a driver in the peripheral area of the substrate; and a support member overlapping the driver. The support member includes a support member pattern layer on a same layer as the pixel defining layer and having repeated patterns

20 Claims, 7 Drawing Sheets

(56) References Cited

U.S. PATENT DOCUMENTS

| | | | | |
|---|---|---|---|---|
| 2023/0163255 A1* | 5/2023 | Kim | ................... | H10H 20/8513 |
| | | | | 359/885 |
| 2024/0155925 A1* | 5/2024 | Shin | ..................... | G09G 3/3233 |
| 2024/0324413 A1* | 9/2024 | Park | ..................... | H10K 59/873 |

FOREIGN PATENT DOCUMENTS

| EP | 3667732 A2 * | 6/2020 | ........... H01L 27/322 |
|---|---|---|---|
| EP | 3940787 A1 * | 1/2022 | ........... H10K 50/844 |
| EP | 3832748 B1 * | 9/2024 | ......... H01L 27/3234 |
| KR | 10-2017-0066725 A | 6/2017 | |
| KR | 10-1975309 B1 | 9/2019 | |
| KR | 10-2021-0024286 A | 3/2021 | |
| KR | 10-2021-0146468 A | 12/2021 | |
| KR | 10-2021-0157947 A | 12/2021 | |

\* cited by examiner

DISPLAY DEVICE

CROSS-REFERENCE TO RELATED APPLICATION

This application claims priority to and the benefit of Korean Patent Application No. 10-2022-0032327 filed on Mar. 15, 2022, in the Korean Intellectual Property Office, the entire contents of which are incorporated herein by reference.

BACKGROUND

1. Field

Aspects of embodiments of the present disclosure relate to a display device.

2. Description of the Related Art

A display device is a device for displaying images on a screen and may be a liquid crystal display (LCD) or an organic light emitting diode (OLED) display, as some examples. Display devices are used in various electronic devices, such as portable phones, GPSs, digital cameras, electronic books, portable game devices, and various terminals.

For example, an organic light emitting device includes two electrodes and an organic emission layer disposed therebetween, and electrons injected from one electrode are combined with holes injected from the other electrode on an organic emission layer to form excitons. The excitons transit to a ground state from an excited state to output energy and emit light.

The organic light emitting device includes a plurality of pixels including an organic light emitting diode, such that it is a self-light-emitting device, and also includes a plurality of transistors and at least one capacitor for driving the organic light emitting diode formed on respective pixels.

To form components configuring the display device, a process for forming a pattern by using a mask (e.g., a predetermined or premanufactured mask) may be performed, but problems, such as damaging of some wires when a substrate is pressed by a mask, may occur.

The above information disclosed in this Background section is for enhancement of understanding of the background of the described technology, and therefore, it may contain information that does not form prior art that is already known to a person of ordinary skill in the art.

SUMMARY

Embodiments of the present disclosure provide a display device that prevents a substrate from being pressed by a mask.

Embodiments of the present disclosure also provide a display device that prevents stains from being generated in a display area by a member.

An embodiment of the present disclosure provides a display device including: a substrate having a display area and a peripheral area at a side of the display area; a transistor in the display area of the substrate; a first electrode connected to the transistor; a pixel defining layer on the first electrode and having a plurality of pixel openings; an emission layer in respective ones of the pixel openings; a second electrode on the emission layer and the pixel defining layer; a driver in the peripheral area of the substrate; and a support member overlapping the driver. The support member includes a support member pattern layer on a same layer as the pixel defining layer and having repeated patterns.

The support member pattern layer may have a plurality of openings that are repeatedly arranged.

Density of a plurality of openings in the support member pattern layer may be equivalent to density of a plurality of pixel openings in the pixel defining layer.

Widths of the openings in the support member pattern layer may correspond to widths of the pixel openings in the pixel defining layer.

A width of the support member pattern layer may correspond to a width of the pixel defining layer.

A distance between adjacent openings from among the openings in the support member pattern layer may correspond to a distance between adjacent pixel openings from among the pixel openings in the pixel defining layer.

A shape of the openings in a plan view may be circular or polygonal.

The openings may be arranged in a row direction and a column direction.

The support member pattern layer may include a plurality of pattern pieces that are repeatedly arranged.

The pixel defining layer may include a light blocking material.

The support member may further include a plurality of organic insulating material layers.

The organic insulating material layers may have a continuous plate shape, and the support member pattern layer may not have a continuous plate shape.

The support member may include: a first organic material layer; a second organic material layer on the first organic material layer; a third organic material layer on the second organic material layer; and a fourth organic material layer on the third organic material layer. The support member pattern layer may be between the third organic material layer and the fourth organic material layer.

The display device may further include: a first passivation layer on the transistor and on a same layer as the first organic material layer; a second passivation layer on the first passivation layer and on a same layer as the second organic material layer; a third passivation layer on the second passivation layer and on a same layer as the third organic material layer; and a spacer on the pixel defining layer and on a same layer as the fourth organic material layer.

The first electrode may be on the third passivation layer.

The display device may further include a connection electrode between the first passivation layer and the second passivation layer. The connection electrode may connect between the transistor and the first electrode.

The driver may include a driving circuit chip.

The display device may further include a data signal transmitting line connected to the driving circuit chip and configured to transmit a data signal. The support member may cover the driving circuit chip and the data signal transmitting line.

The peripheral area may have: a first area surrounding a periphery of the display area; a second area spaced from a one-side edge of the first area; and a bending area between the first area and the second area. The driving circuit chip may be in the second area.

The support member pattern layer may be in the first area and the second area and may not be in the bending area.

According to embodiments of the present disclosure, the substrate may not be pressed by a mask during manufacture, and the wires may not be damaged by forming the support member made of an organic material.

By forming a pattern (e.g., a predetermined pattern) on the support member made of the organic material, stains in the display area may be prevented.

DETAILED DESCRIPTION

Figure 1:
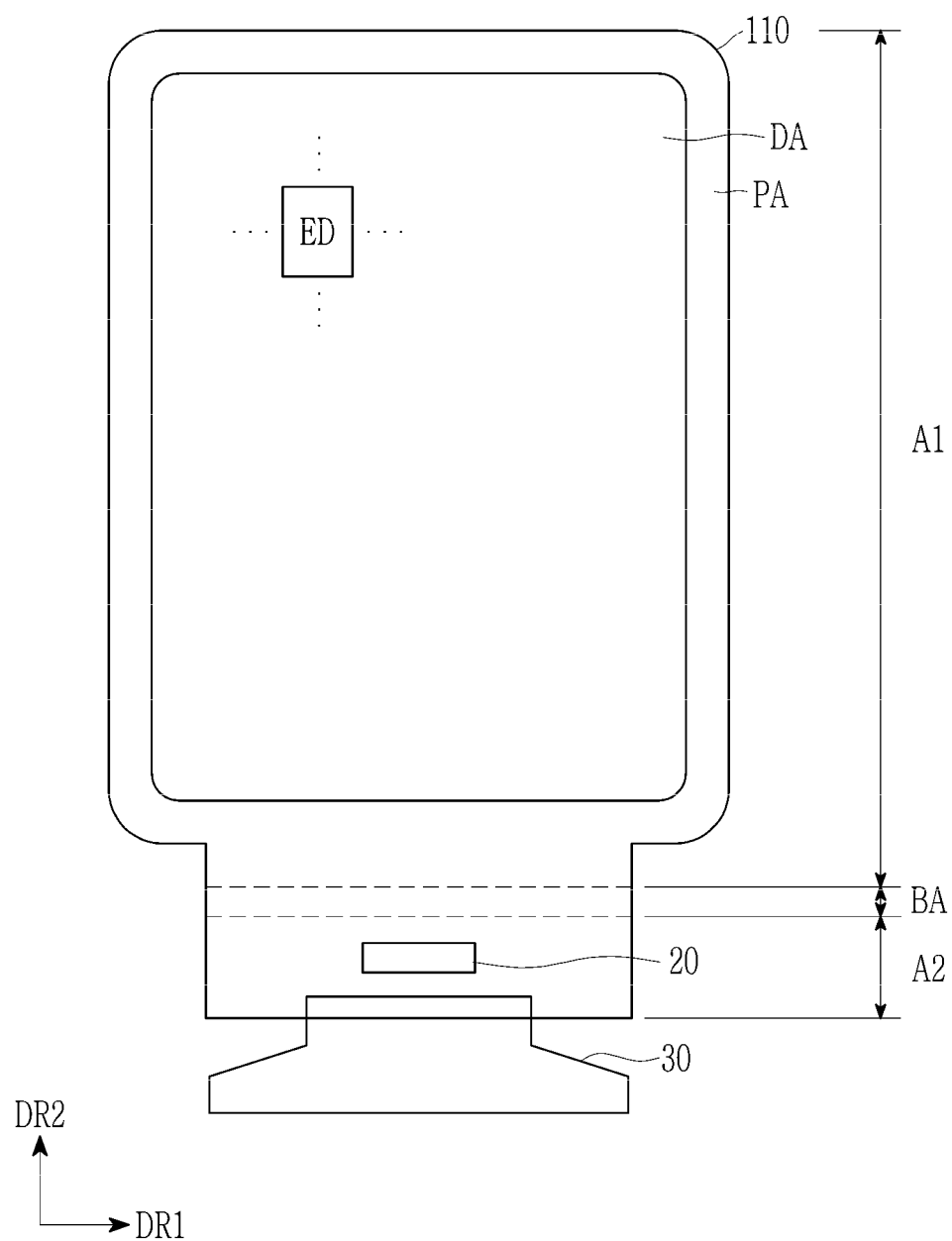
FIG. 1 shows a top plan view of a display device according to an embodiment.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

Aspects of the present disclosure that are irrelevant to the description may be omitted to more clearly describe the present disclosure, and the same elements will be designated by the same reference numerals throughout the specification.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof. Further, the phrase "on a plane" means viewing the object portion from the top, and the phrase "on a cross-section" means viewing a cross-section of which the object portion is vertically cut from the side.

A display device according to an embodiment will now be described with reference to FIGS. 1 and 2.

Figure 2:
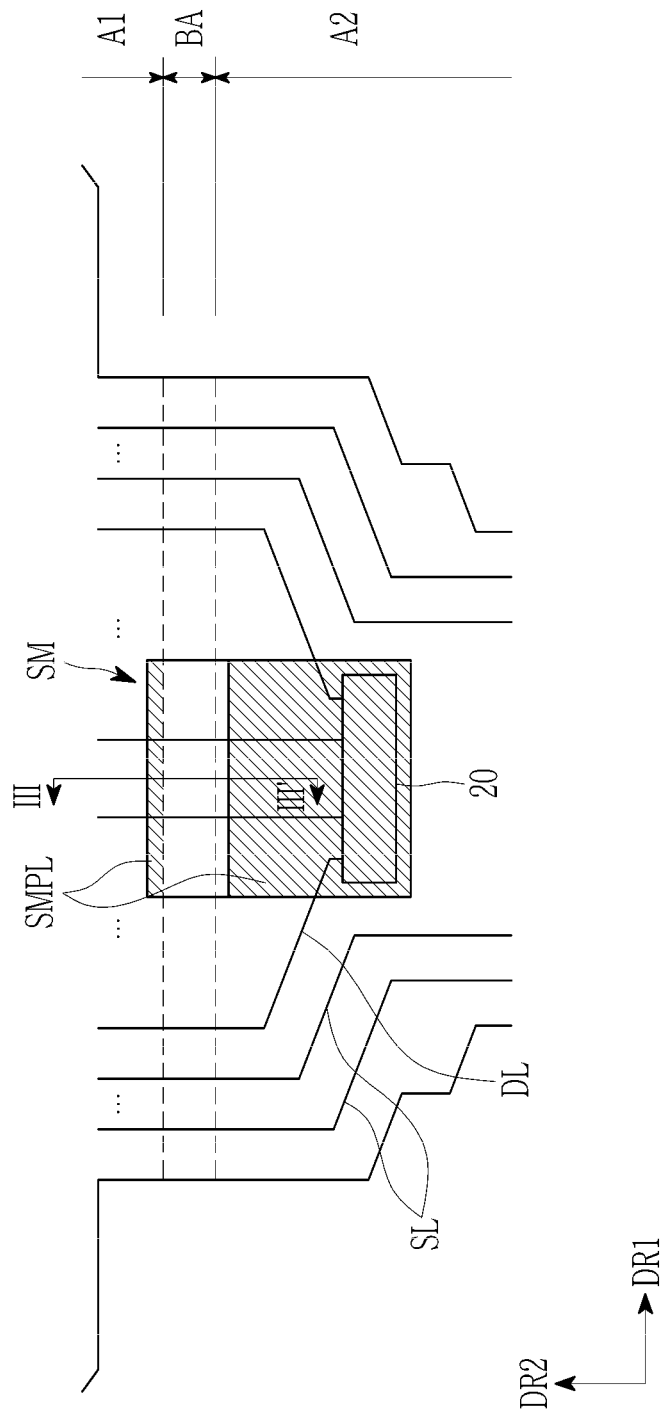
FIG. 2 shows a top plan view of a region of FIG. 1.

FIG. 1 shows a top plan view of a display device according to an embodiment, and FIG. 2 shows a top plan view of a region of FIG. 1.

As shown in FIG. 1 and FIG. 2, the display device according to an embodiment includes a substrate 110 having a display area DA and a peripheral area PA near (e.g., around a periphery of) the display area DA, a light-emitting device ED positioned in the display area DA of the substrate 110, and a driver positioned in the peripheral area PA of the substrate 110.

The substrate 110 may be made of a flexible, stretchable, foldable, bendable, or rollable material.

Images are displayed at the display area DA, and the display area DA may have a substantially quadrangular shape. For example, the display area DA may have a rectangular shape with two sides extending in a first direction DR1 and two sides extending in a second direction DR2, and a corner portion may be chamfered in a round shape. However, this is only an example, and the shape of the display area DA may be modified in many ways according to uses of the display device.

A plurality of light-emitting devices ED may be disposed in a form (e.g., an arrangement or predetermined form or arrangement) in the display area DA. For example, a plurality of light-emitting devices ED may be disposed in a row direction and a column direction. However, this is only an example, and the arrangement of the light-emitting devices ED may be modified in many ways. The respective light-emitting devices ED may receive signals (e.g., predetermined signals) through a plurality of signal lines. The signal lines and the light-emitting device ED may be connected to each other via transistors. For example, the transistors and the signal lines connected to the light-emitting device ED may be positioned in the display area DA. The signal lines may include a scan line, a data line, a driving voltage line, an initialization voltage line, and a common voltage line. The signal lines may extend in one direction and may be connected to a plurality of light-emitting devices ED.

A touch sensor for sensing contact and/or non-contact touches of a user may be disposed in the display area DA.

The peripheral area PA may be positioned on an external side of the display area DA and may surround (e.g., may surround in a plan view) the display area DA. The peripheral area PA may have a first area A1 surrounding the display area DA, a second area A2 spaced from one-side edge of the first area A1, and a bending area BA positioned between the first area A1 and the second area A2. For example, the bending area BA may extend from a lower-side edge of the first area A1, and the second area A2 may extend from the bending area BA. The substrate 110 may be bent at the bending area BA. The bending area BA may extend (e.g., may primarily extend) in the first direction DR1. When the substrate 110 is bent along the bending area BA, the second area A2 may be positioned on a rear side of the first area A1. For example, the second area A2 overlaps the first area A1 when the substrate 110 is bent.

A driver for (e.g., configured for) generating and transmitting signals for driving the display device according to an embodiment, such as a driving circuit chip 20, a flexible printed circuit 30, and a scan driver may be positioned in the peripheral area PA. The driving circuit chip 20 and the flexible printed circuit 30 may be positioned in the second area A2. The driving circuit chip 20 may be connected to the light-emitting device ED positioned in the display area DA through wires and may transmit various types of signals. For example, the driving circuit chip 20 may be connected to the data signal transmitting line DL and may transmit data signals. The flexible printed circuit 30 may be attached to one-side edge of the substrate 110. For example, the flexible printed circuit 30 may be attached to an end portion of the second area A2. The flexible printed circuit 30 may be made of a flexible substance (or a flexible material), and a circuit for controlling the driving of the display device according to an embodiment may be designed thereon. The scan driver may be positioned in the first area A1 and may be positioned near a left-side edge and/or a right-side edge of the display area DA in the first area A1. The scan driver may be connected to the light-emitting device ED through a scan line and may transmit scan signals. The respective light-emitting devices ED may receive data signals at timings (e.g., predetermined timings) according to the scan signals. Signal lines SL for transmitting various types of control signals, driving voltages, and common voltages may be positioned in the peripheral area PA. The signal lines SL may be connected to the flexible printed circuit 30 and may receive signals (e.g., predetermined signals) from the flexible printed circuit 30.

The respective signal lines SL and the data signal transmitting line DL may extend from the driving circuit chip 20 and the flexible printed circuit 30 positioned in the second area A2 and may extend to the first area A1 through the bending area BA. The data signal transmitting line DL may be connected to the data line positioned in the display area DA and may transmit data signals to the respective light-emitting devices ED through the data line.

A support member SM may be positioned on the substrate 110. The support member SM may be positioned in the peripheral area PA and may overlap the driver. For example, the support member SM may overlap the data signal transmitting line DL connected to the driving circuit chip 20 and the driving circuit chip 20. The support member SM may be positioned in the second area A2 and may be positioned in the bending area BA and the first area A1. The support member SM is primarily positioned in the second area A2 (e.g., most of the support member SM is positioned in the second area A2). The support member SM may have a quadrangular shape with two sides substantially extending in the first direction DR1 and two sides extending in the second direction DR2 in a plan view. However, the shape of the support member SM in a plan view is not limited thereto and may be modified in many ways. The support member SM may be a stack of a plurality of layers and may include a support member pattern layer SMPL as one of the layers. FIG. 2 shows a position at where the support member pattern layer SMPL is formed but does not show a detailed shape of the support member pattern layer SMPL in a plan view. The shape of the support member pattern layer SMPL in a plan view will be described later. The support member pattern SMPL may be positioned in a portion of the region at where the support member SM is formed. The support member pattern layer SMPL may be positioned in the first area A1 and the second area A2 but may not be positioned in the bending area BA.

A cross-sectional view of a display device according to an embodiment will now be described with reference to FIG. 3.

Figure 3:
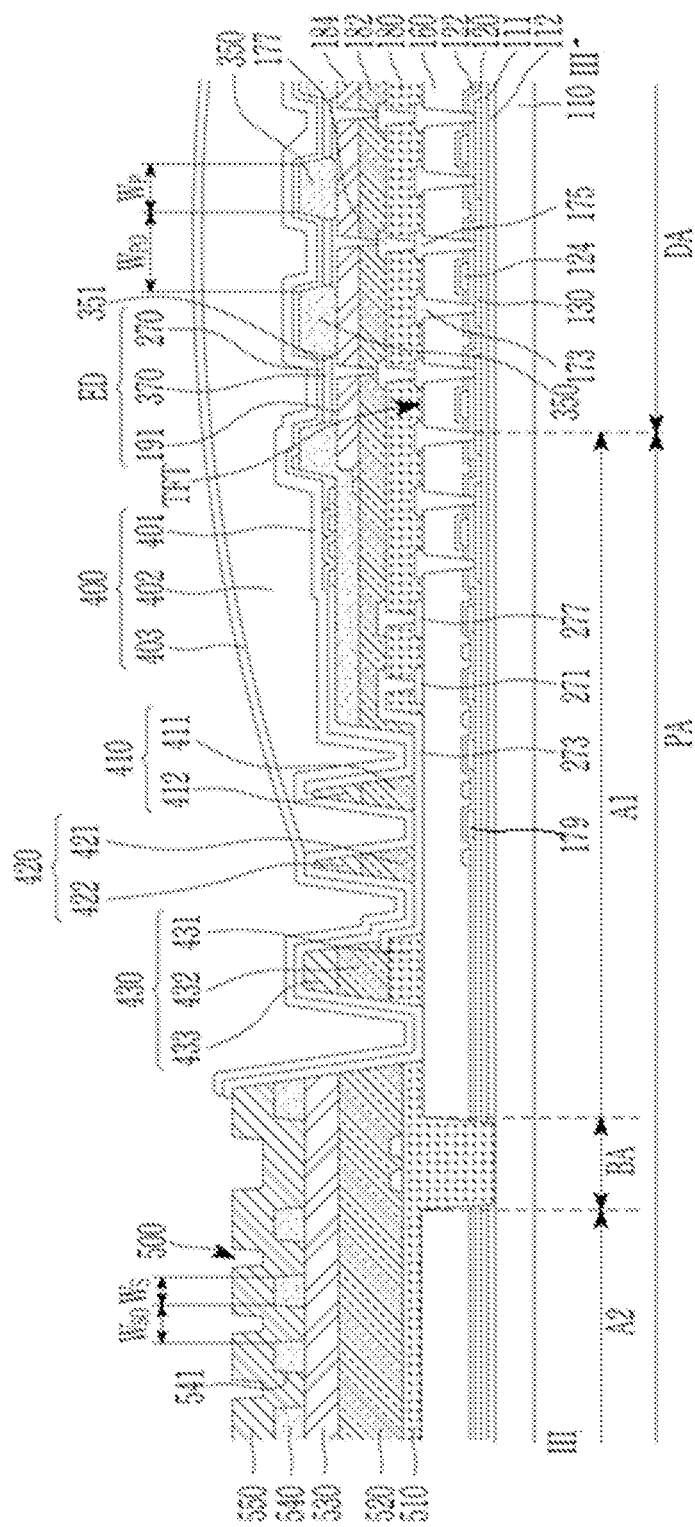
FIG. 3 shows a cross-sectional view taken along the line III-III' of FIG. 2.

FIG. 3 shows a cross-sectional view taken along the line III-III' of FIG. 2.

As shown in FIG. 3, the display device includes the substrate 110, a transistor TFT positioned in the display area DA of the substrate 110, and a light-emitting device ED connected to the transistor TFT. The light-emitting device ED may be positioned in the display area DA and may emit a color (e.g., a predetermined color) to display an image.

A buffer layer 111 for smoothing a surface of the substrate 110 and for blocking permeation of impurities may be further positioned on the substrate 110. The buffer layer 111 may include an inorganic material; for example, it may include an inorganic insulating material, such as a silicon nitride ($SiN_x$), a silicon oxide ($SiO_x$), or a silicon oxynitride ($SiO_xN_y$). The buffer layer 111 may be a single-layer or may have a multilayer structure of the material(s). A barrier layer 112 may be further positioned on the substrate 110. The barrier layer 112 may be positioned between the substrate 110 and the buffer layer 111. The barrier layer 112 may include an inorganic insulating material, such as a silicon nitride ($SiN_x$), a silicon oxide ($SiO_x$), or a silicon oxynitride ($SiO_xN_y$). The barrier layer 112 may be a single-layer or may have a multilayer structure of the material(s).

A semiconductor 130 may be positioned on the buffer layer 111. The semiconductor 130 may include one of amorphous silicon, polycrystalline silicon, and an oxide semiconductor. For example, the semiconductor 130 may include a low temperature polycrystalline silicon (LTPS) or may include an oxide semiconductor material including at least one of zinc (Zn), indium (In), gallium (Ga), tin (Sn), and a mixture thereof. For example, the semiconductor 130 may include an indium-gallium-zinc oxide (IGZO). The semiconductor 130 may have a channel region, a source region, and a drain region distinguished by whether impurities are doped thereto. A source region and a drain region may be respectively positioned on both sides (e.g., opposite sides) of the channel region of the semiconductor 130. The source region and the drain region have conductive characteristics corresponding to conductors.

A first gate insulating layer 120 may be positioned on the semiconductor 130. The first gate insulating layer 120 may cover the semiconductor 130 and the substrate 110. The first gate insulating layer 120 may include an inorganic insulating material, such as a silicon nitride ($SiN_x$), a silicon oxide ($SiO_x$), or a silicon oxynitride ($SiO_xN_y$). The first gate insulating layer 120 may be a single-layer or may have a multilayer structure of the material(s).

A gate electrode 124 may be positioned on the first gate insulating layer 120. The gate electrode 124 may include a metal, such as copper (Cu), molybdenum (Mo), aluminum (Al), silver (Ag), chromium (Cr), tantalum (Ta), or titanium (Ti), or a metal alloy thereof. The gate electrode 124 may be a single layer or may have a multilayer structure. A doping process or a plasma process may be performed when the gate electrode 124 is formed. A portion of the semiconductor 130 covered by the gate electrode 124 may not be doped or plasma processed, and a portion of the semiconductor 130 not covered by the gate electrode 124 may be doped or plasma processed to have a same characteristic as the conductor. A region of the semiconductor 130 overlapping the gate electrode 124 in a plan view may be a channel region.

A second gate insulating layer 122 and an interlayer insulating layer 160 may be positioned on the gate electrode 124. The second gate insulating layer 122 and the interlayer insulating layer 160 may cover the gate electrode 124 and the first gate insulating layer 120. The second gate insulating layer 122 and the interlayer insulating layer 160 may include an inorganic insulating material, such as a silicon nitride ($SiN_x$), a silicon oxide ($SiO_x$), or a silicon oxynitride ($SiO_xN_y$). The second gate insulating layer 122 and the interlayer insulating layer 160 may be a single-layer or may have a multilayer structure of the material(s).

A source electrode 173 and a drain electrode 175 may be positioned on the interlayer insulating layer 160. The source electrode 173 and the drain electrode 175 are respectively connected to a source region and a drain region of the semiconductor 130 via openings formed in the interlayer insulating layer 160, the second gate insulating layer 122, and the first gate insulating layer 120. The source electrode 173 and the drain electrode 175 may include a metal, such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. The source electrode 173 and the drain electrode 175 may be a single layer or may have a multilayer structure. The source electrode 173 and the drain electrode 175 may have a triple layer structure including an upper layer, an intermediate layer, and a lower layer. The upper layer and the lower layer may include titanium (Ti), and the intermediate layer may include aluminum (Al).

The above-described semiconductor 130, gate electrode 124, source electrode 173, and drain electrode 175 configure (or form) one transistor TFT. In some embodiments, the transistor TFT may omit the source electrode 173 and the drain electrode 175 but may include the source region and the drain region of the semiconductor 130. FIG. 3 shows an embodiment in which the respective light-emitting devices ED are connected to one transistor TFT, but the respective light-emitting devices ED may be connected to a plurality of transistors TFT. For example, one light-emitting device ED may be connected to a switching transistor and a driving transistor. In another embodiment, one light-emitting device ED may be connected to at least three transistors.

A first passivation layer 180 may be positioned on the source electrode 173 and the drain electrode 175. The first passivation layer 180 covers the source electrode 173, the drain electrode 175, and the interlayer insulating layer 160. The first passivation layer 180 planarizes the surface of the substrate 110 on which transistors TFT are formed, may be an organic insulator, and may include at least one material from among a polyimide, a polyamide, an acryl resin, a benzocyclobutene, and a phenol resin.

A connection electrode 177 may be positioned on the first passivation layer 180. The connection electrode 177 may connect between the transistor TFT and the light-emitting device ED. The connection electrode 177 may include a conductive material and may be a single layer or may have a multilayer structure. The first passivation layer 180 may have a via hole exposing at least part of the drain electrode 175. The connection electrode 177 may be physically and electrically connected to the drain electrode 175 through the via hole in the first passivation layer 180.

A second passivation layer 182 may be positioned on the connection electrode 177. The second passivation layer 182 covers the connection electrode 177 and the first passivation layer 180. A third passivation layer 184 may be positioned on the second passivation layer 182. The second passivation layer 182 and the third passivation layer 184 may be organic insulators and may include at least one material from among a polyimide, a polyamide, an acryl resin, a benzocyclobutene, and a phenol resin.

A pixel electrode 191 may be positioned on the third passivation layer 184. The pixel electrode 191 may be referred to as an anode, and the pixel electrode 191 may be a single layer including a transparent conductive oxide film or a metal material or may have a multilayer structure including the same. The transparent conductive oxide film may include an indium tin oxide (ITO), a poly-ITO, an indium zinc oxide (IZO), an indium gallium zinc oxide (IGZO), and an indium tin zinc oxide (ITZO). The metal material may include silver (Ag), molybdenum (Mo), copper (Cu), gold (Au), and aluminum (Al).

The second passivation layer 182 and the third passivation layer 184 may have a via hole exposing at least part of the connection electrode 177. The pixel electrode 191 may be physically and electrically connected to the connection electrode 177 through the via hole in the second passivation layer 182 and the third passivation layer 184. Accordingly, the pixel electrode 191 may receive an output current to be transmitted to the emission layer 370 through the connection electrode 177 and the drain electrode 175.

A pixel defining layer 350 may be positioned on the pixel electrode 191 and the third passivation layer 184. The pixel defining layer 350 has a pixel opening 351 overlapping at least part of the pixel electrode 191. The pixel opening 351 may overlap a center portion of the pixel electrode 191 but may not overlap an edge portion of the pixel electrode 191 (e.g., the pixel defining layer 350 may cover the edge portion of the pixel electrode 191). Therefore, the pixel opening 351 may be smaller than the pixel electrode 191. The pixel defining layer 350 may partition a formation position of the emission layer 370 so that the emission layer 370 may be positioned on a portion in which an upper side of the pixel electrode 191 is exposed. The pixel defining layer 350 may include an organic insulator including at least one material from among a polyimide, a polyamide, an acryl resin, a benzocyclobutene, and a phenol resin. The pixel defining layer 350 may include a light blocking material and may be black in color. The light blocking material may include a resin or a paste including carbon black, carbon nanotubes, a black dye, a metal particle, for example, nickel, aluminum, molybdenum, and an alloy thereof, metal oxide particles (e.g., a chromium oxide), or metal nitride particles (e.g., a chromium nitride). When the pixel defining layer 350 includes the light blocking material, reflection of external light by metallic structures disposed on a lower side of the pixel defining layer 350 may be reduced. However, without being limited thereto and in some embodiments, the pixel defining layer 350 may omit a light blocking material and may include a transmissive organic insulating material.

A spacer may be further positioned on the pixel defining layer 350. The spacer may include a same material as the pixel defining layer 350. However, without being limited thereto and in some embodiments, the spacer may be made of a material that is different from the pixel defining layer 350. The spacer may be an organic insulator including at least one material from among a polyimide, a polyamide, an acryl resin, a benzocyclobutene, and a phenol resin.

An emission layer 370 may be positioned on the pixel electrode 191. The emission layer 370 may be positioned in the pixel opening 351 partitioned by the pixel defining layer 350. The emission layer 370 may include an organic material for emitting light, such as red, green, and blue light. The emission layer 370 for emitting red, green, and blue light may include a low-molecular weight or high-molecular weight organic material. FIG. 3 shows an embodiment in which the emission layer 370 is a single layer but auxiliary layers, such as an electron injection layer, an electron transport layer, a hole transport layer, and/or a hole injection layer, may be included at the top and bottom of the emission layer 370. The hole injection layer and the hole transport layer may be positioned at a bottom of the emission layer 370, and the electron transport layer and the electron injection layer may be positioned at a top of the emission layer 370.

A common electrode 270 may be positioned on the pixel defining layer 350 and the emission layer 370. The common electrode 270 may be referred to as a cathode and may be made of a transparent conductive layer including an indium tin oxide (ITO), an indium zinc oxide (IZO), an indium gallium zinc oxide (IGZO), and an indium tin zinc oxide (ITZO). The common electrode 270 may have a semi-transparent characteristic and may form (or configure) a microcavity with the pixel electrode 191. According to the microcavity structure, light with a specific wavelength is output upwardly by a gap between respective electrodes, and as a result, red, green, or blue may be displayed.

The pixel electrode 191, the emission layer 370, and the common electrode 270 may configure (or form) a light-emitting device ED. The pixel electrode 191 may be an anode, that is, a hole injection electrode, and the common electrode 270 may be a cathode, that is, an electron injection electrode. However, without being limited thereto and in some embodiments, the anode and the cathode may be provided in an opposite way depending on methods for driving the display device.

Light is emitted when the holes and electrons are injected into the emission layer 370 from the pixel electrode 191 and the common electrode 270, and excitons that are a combination of the injected holes and electrons fall to the ground state from the excited state.

An encapsulation layer 400 may be positioned on the common electrode 270. The encapsulation layer 400 may include at least one inorganic film and at least one organic film. In the illustrated embodiment, the encapsulation layer 400 includes a first inorganic encapsulation layer 401, an organic encapsulation layer 402, and a second inorganic encapsulation layer 403. However, this is an example, and the numbers of inorganic films and organic films configuring the encapsulation layer 400 may be modified in many ways. The first inorganic encapsulation layer 401, the organic encapsulation layer 402, and the second inorganic encapsulation layer 403 may be positioned in part of the display area DA and the peripheral area PA. According to an embodiment, the organic encapsulation layer 402 is formed around the display area DA, and the first inorganic encapsulation layer 401 and the second inorganic encapsulation layer 403 may be formed up to the peripheral area PA. The encapsulation layer 400 protects the light-emitting device (ED) from moisture or oxygen that may permeate from the outside, and end portions of the first inorganic encapsulation layer 401 and the second inorganic encapsulation layer 403 may be formed to directly contact each other.

Similar to the display area DA, the barrier layer 112, the buffer layer 111, the first gate insulating layer 120, the second gate insulating layer 122, and the interlayer insulating layer 160 may be positioned in the peripheral area PA of the substrate 110. The barrier layer 112, the buffer layer 111, the first gate insulating layer 120, the second gate insulating layer 122, and the interlayer insulating layer 160 may be positioned in most of the first area A1 and the second area A2 of the peripheral area PA. The barrier layer 112, the buffer layer 111, the first gate insulating layer 120, the second gate insulating layer 122, and the interlayer insulating layer 160 may not be positioned in at least part of the bending area BA of the peripheral area PA. Flexibility of the bending area BA of the substrate 110 may be increased by removing at least part of one or more layers positioned in the bending area BA. FIG. 3 shows an embodiment in which the interlayer insulating layer 160 is removed from the barrier layer 112 in the bending area BA, but without being limited thereto, some layers may remain in the bending area BA. For example, the barrier layer 112 and the buffer layer 111 may be generally positioned in the bending area BA.

Various types of signal lines and the driver may be positioned in the peripheral area PA of the substrate 110.

A data signal transmitting line 179 may be positioned in the peripheral area PA of the substrate 110. The data signal transmitting line 179 may be connected to the respective light-emitting devices ED positioned in the display area DA through the data line and may receive data signals. FIG. 3 shows that the data signal transmitting line 179 is positioned in the first area A1 of the peripheral area PA, but the data signal transmitting line 179 extends to the bending area BA and the second area A2. The data signal transmitting line 179 may be connected to a driving circuit chip (see, e.g., 20 of FIG. 2) positioned in the second area A2 and may receive the data signals. At least part of the data signal transmitting line 179 may be positioned on a same layer as the gate electrode 124 and may include a same material. Another part of the data signal transmitting line 179 may be positioned on the second gate insulating layer 122. An interlayer insulating layer 160 may be positioned on the data signal transmitting line 179 and the second gate insulating layer 122.

A common voltage transmitting line 271 and a driving voltage transmitting line 277 may be positioned on the interlayer insulating layer 160. The common voltage transmitting line 271 and the driving voltage transmitting line 277 may be positioned on a same layer as the source electrode 173 and the drain electrode 175 and may include a same material. The common electrode 270 may extend from the display area DA and may reach the peripheral area PA and may be electrically connected to the common voltage transmitting line 271. A common voltage connecting line 273 for connecting between the common voltage transmitting line 271 and the common electrode 270 may be positioned on the first passivation layer 180. The common voltage connecting line 273 may be positioned on a same layer as the connection electrode 177 and may include a same material. The driving voltage transmitting line 277 may be connected to the respective light-emitting devices ED positioned in the display area DA through a driving voltage line and may transmit driving voltages.

Dams 410, 420, and 430 may be positioned in the peripheral area PA of the substrate 110. The dams 410, 420, and 430 may be positioned in the first area A1 of the peripheral area PA. For example, the dams 410, 420, and 430 may be positioned between the display area DA and the bending area BA. The dams 410, 420, and 430 may be positioned on the interlayer insulating layer 160. The display device according to an embodiment may include a plurality of dams 410, 420, and 430; for example, the display device may include a first dam 410, a second dam 420, and a third dam 430. However, this is only an example, and the number of dams may be appropriately changed. The first dam 410 may be positioned nearest the display area DA, and the third dam 430 may be positioned farthest from the display area DA. The second dam 420 may be positioned between the first dam 410 and the third dam 430.

The first dam 410 may include a first layer 411 and a second layer 412. The second layer 412 may be positioned on the first layer 411 of the first dam 410. The first layer 411 of the first dam 410 may be positioned on a same layer as the second passivation layer 182 and may include a same material. The second layer 412 of the first dam 410 may be positioned on a same layer as the spacer and may include a same material.

The second dam 420 may include a first layer 421 and a second layer 422. A second layer 422 may be positioned on the first layer 421 of the second dam 420. The first layer 421 of the second dam 420 may be positioned on a same layer as the second passivation layer 182 and may include a same material. The second layer 422 of the second dam 420 may be positioned on a same layer as the spacer and may include a same material.

The third dam 430 may include a first layer 431, a second layer 432, and a third layer 433. The second layer 432 may be positioned on the first layer 431 of the third dam 430, and the third layer 433 may be positioned on the second layer 432. The first layer 431 of the third dam 430 may be positioned on a same layer as the first passivation layer 180 and may include a same material. The second layer 432 of the third dam 430 may be positioned on a same layer as the second passivation layer 182 and may include a same material. The third layer 433 of the third dam 430 may be positioned on a same layer as the spacer and may include a same material.

It has been described above that the first dam 410 and the second dam 420 have a double-layer structure and the third dam 430 has a triple-layer structure, but without being limited thereto, the dams may be modified in many ways. The number of the layers configuring (or forming) the dams 410, 420, and 430 may be increased or decreased.

The encapsulation layer 400 may extend from the display area DA and may reach the peripheral area PA. The first inorganic encapsulation layer 401 and the second inorganic encapsulation layer 403 may be generally positioned in the display area DA and may be mostly positioned in the first area A1 of the peripheral area PA. End portions of the first inorganic encapsulation layer 401 and the second inorganic encapsulation layer 403 may be positioned on a border between the first area A1 and the bending area BA. The organic encapsulation layer 402 may generally be positioned in the display area DA and may be positioned in part of the first area A1 of the peripheral area PA. An end portion of the organic encapsulation layer 402 may reach the second dam 420. The organic encapsulation layer 402 may overlap part of the second dam 420. The second dam 420 may control spreading of a material for forming the organic encapsulation layer 402 in a process for forming the organic encapsulation layer 402. The organic encapsulation layer 402 may fill a space between the end portion of the display area DA and the second dam 420. The organic encapsulation layer 402 may be positioned between the first inorganic encapsulation layer 401 and the second inorganic encapsulation layer 403 at a portion where the organic encapsulation layer 402 is positioned, and the second inorganic encapsulation layer 403 may be positioned on the first inorganic encapsulation layer 401 at a portion where the organic encapsulation layer 402 is not positioned.

A support member 500 may be positioned in the peripheral area PA of the substrate 110. The support member 500 may be positioned in the second area A2 and the bending area BA. The support member 500 may be positioned on an edge of the first area A1 disposed near the bending area BA. The support member 500 may be positioned on the interlayer insulating layer 160. However, the support member 500 may be positioned on the substrate 110 in at least part of the bending area BA.

The support member 500 may be made of a plurality of organic insulating material layers. The support member 500 may include a first organic material layer 510, a second organic material layer 520, a third organic material layer 530, a support member pattern layer 540, and a fourth organic material layer 550. The second organic material layer 520 may be positioned on the first organic material layer 510, and the third organic material layer 530 may be positioned on the second organic material layer 520. The support member pattern layer 540 may be positioned on the third organic material layer 530, and the fourth organic material layer 550 may be positioned on the support member pattern layer 540. The first organic material layer 510 may be positioned on a same layer as the first passivation layer 180 and may include a same material. The second organic material layer 520 may be positioned on a same layer as the second passivation layer 182 and may include a same material. The third organic material layer 530 may be positioned on a same layer as the third passivation layer 184 and may include a same material. The support member pattern layer 540 may be positioned on a same layer as the pixel defining layer 350 and may include a same material. The fourth organic material layer 550 may be positioned on a same layer as the spacer and may include a same material. However, this is only an example, and the number of the layers configuring the support member 500 may be modified in many ways.

The first organic material layer 510, the second organic material layer 520, the third organic material layer 530, and the fourth organic material layer 550 may be mostly positioned in a region in which the support member 500 is positioned in a plan view. For example, the first organic material layer 510, the second organic material layer 520, the third organic material layer 530, and the fourth organic material layer 550 may be made as a whole plate shape (e.g., a continuous plate shape) and may have similar planar shapes.

The support member pattern layer 540 may be positioned in part of a region in which the support member 500 is positioned and may not be positioned in other regions. The support member pattern layer 540 may be positioned in the first area A1 and the second area A2 and may not be positioned in the bending area BA. The support member pattern layer 540 may not have a whole (or continuous) plate shape may have a pattern (e.g., a predetermined pattern) formed therein. For example, the support member pattern layer 540 may have an opening 541. The opening 541 in the support member pattern layer 540 represents an inner pattern at where the support member pattern layer 540 is removed. The opening 541 in the support member pattern layer 540 may be repeatedly arranged (e.g., the support member pattern layer 540 may have a plurality of openings 541). Densities (e.g., arrangement densities or spacings) of the plurality of openings 541 in the support member pattern layer 540 may be similar to densities of a plurality of pixel openings 351 of the pixel defining layer 350 and may be substantially equal to each other. A width Wso of the opening 541 in the support member pattern layer 540 may correspond to a width Wpo of the pixel opening 351. For example, the width Wso of the opening 541 in the support member pattern layer 540 may be similar to the width Wpo of the pixel opening 351. A width Ws of the support member pattern layer 540 may correspond to a width Wp of the pixel defining layer 350. For example, the width Ws of the support member pattern layer 540 may be similar to the width Wp of the pixel defining layer 350. For example, a distance between adjacent openings 541 from among a plurality of openings 541 of the support member pattern layer 540 may be similar to a distance between adjacent pixel openings 351 from among a plurality of pixel openings 351.

Various shapes of a support member pattern layer of a support member of a display device in a plan view according to embodiments will now be described with reference to FIG. 4 to FIG. 6.

Figure 4:
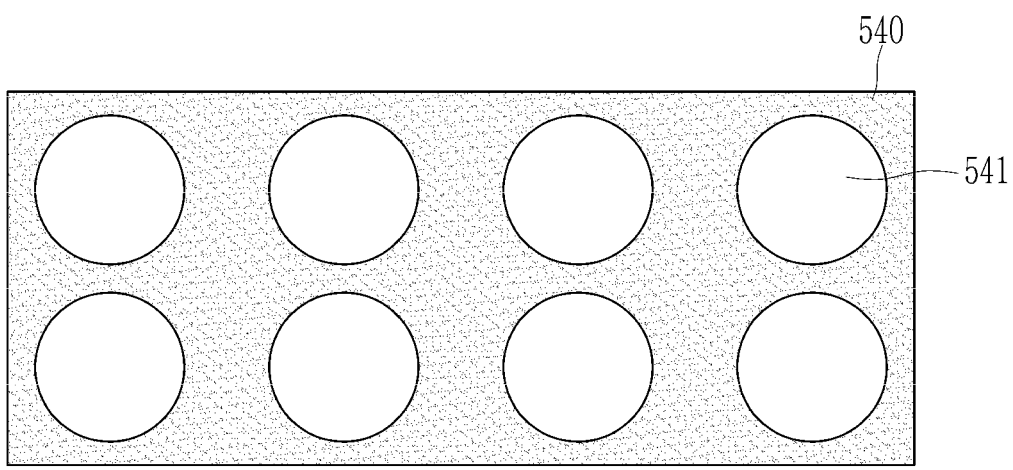
FIGS. 4 to 6 show top plan views of a support member pattern layer of a display device according to embodiments.
Figure 5:
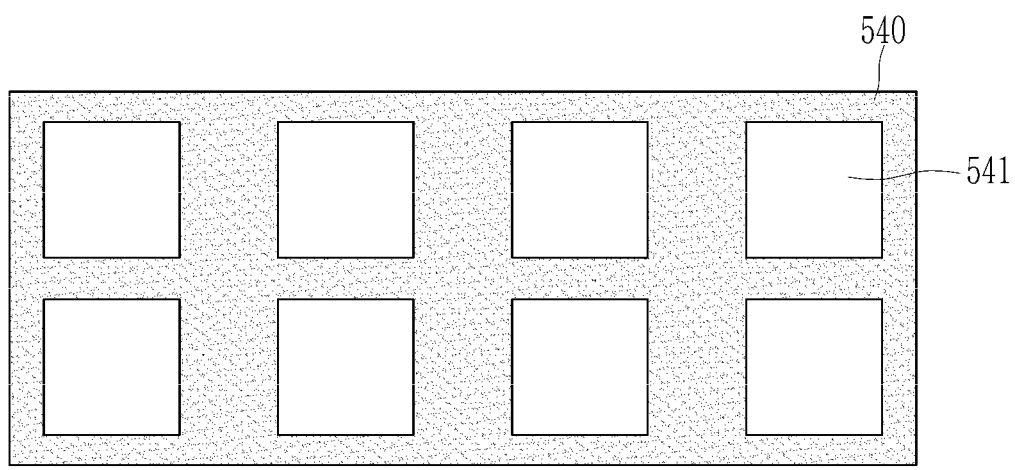
Figure 6:
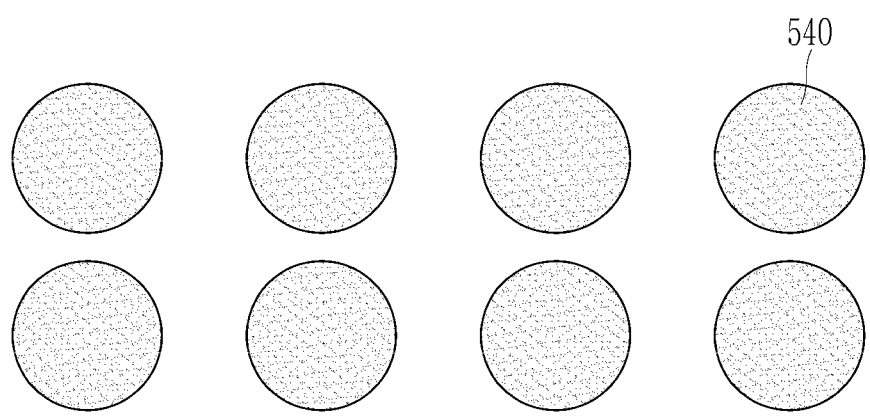

FIGS. 4 to 6 show top plan views of a support member pattern layer of a display device according to embodiments.

As shown in FIG. 4, the support member pattern layer 540 of a display device according to an embodiment may have a plurality of openings 541. The openings 541 may be repeatedly disposed. For example, the openings 541 may be disposed in a row direction and a column direction. However, disposal of the openings 541 is not limited thereto and may be modified in many ways. For example, the openings 541 may be alternately disposed. The openings 541 may form a circle (or may have a circle shape).

As shown in FIG. 5, the support member pattern layer 540 of a display device according to an embodiment may have a plurality of openings 541, and the openings 541 may form a quadrangle (or have a quadrangle shape). However, the shape of the openings 541 is not limited thereto and may be modified in many ways. For example, the openings 541 may form a polygon (or may have a polygon shape), such as a hexagon or an octagon.

FIGS. 4 and 5 show that the openings 541 have the same shape and the same size, but the present disclosure is not limited thereto. The openings 541 may have different shapes or may have different sizes. The display device may include a plurality of pixels, such as a red pixel, a green pixel, and a blue pixel, and the shapes and/or the sizes of the pixel openings of the red pixel, the green pixel, and the blue pixel may be different. Here, some of the openings 541 may correspond to the shape and the size of the pixel opening of the red pixel, while others thereof may correspond to the shape and the size of the pixel opening of the green pixel, while still others thereof may correspond to the shape and the size of the pixel opening of the blue pixel.

As shown in FIG. 6, the support member pattern layer 540 may be configured with a plurality of pattern pieces that are separated from each other. The respective pattern pieces of the support member pattern layer 540 may form a circle (or may have a circle shape). However, the shape of pattern pieces of the support member pattern layer 540 is not limited thereto and may be modified in many ways. For example, the support member pattern layer 540 may be a polygon, such as a quadrangle.

In a process for manufacturing a display device according to an embodiment, a stage for forming an emission layer 370, a common electrode 270, a first inorganic encapsulation layer 401, and an organic encapsulation layer 402 may include performing a deposition process by use of an open mask. A portion of the open mask corresponding to the display area DA may be opened. While the open mask is positioned near the substrate 110, a deposition process may be performed, and part of the peripheral area PA may generate a pressed shape caused by the open mask (e.g., may be pressed by the open mask). Regarding the display device according to an embodiment, because the support member 500 is positioned in the peripheral area PA of the substrate 110, the open mask may be supported. Therefore, the substrate 110 may be prevented not be pressed by the open mask, and the wires, such as the data signal transmitting line DL positioned in the peripheral area PA of the substrate 110, or the driver may not be damaged.

The support member 500 may be formed by stacking various types of organic films positioned in the display area DA, and the organic films may include a support member pattern layer 540 positioned on a same layer as the pixel defining layer 350. The pixel defining layer 350 may include a light blocking material, such as a black dye, and may include a pixel opening 351 for defining respective pixels. The pixel opening 351 may be periodically formed in the pixel defining layer 350 in the display area DA, and in an embodiment in which the support member pattern layer 540 is formed as a whole (or continuous) plate in the peripheral area PA, may be considered as a comparative embodiment. In the comparative embodiment, when a material for forming a pixel defining layer is applied and the photo process is performed, the densities for performing development by a developer in the display area DA and the peripheral area PA may be different from each other. Because the support member pattern layer 540 positioned in the peripheral area PA is made as a whole plate, the density of a portion where the development by the developer is performed is relatively low. Therefore, over-development may occur at the edge of the display area DA near the support member pattern layer 540. Accordingly, a thickness of the pixel defining layer 350 positioned on the edge of the display area DA disposed near the support member pattern layer 540 may be reduced, and this may cause stains. At a portion where the thickness of the pixel defining layer 350 is reduced, the emission layer 370 may leave the inside of the pixel opening 351 and may reach another pixel, and the corresponding pixel may become defective.

The support member pattern layer 540 according to embodiments may have a similar density to the pixel defining layer 350 by including openings (or pattern pieces). Hence, the support member pattern layer 540 may not have a different developing density in a process for forming the pixel defining layer 350 and the support member pattern layer 540. That is, the developing density of the display area DA may be similar to the developing density of the peripheral area PA, and uniform development may be performed in the display area DA. Therefore, the pixel defining layer 350 may form a uniform thickness and stains may be prevented.

A display device according to an embodiment will now be described with reference to FIG. 7.

The display device shown in FIG. 7 mostly corresponds to the display device described with reference to FIGS. 1 to 6, and a description of the same parts will be omitted. A region in which the support member is formed according to the present embodiment is different from the previous embodiment, which will be primarily described.

Figure 7:
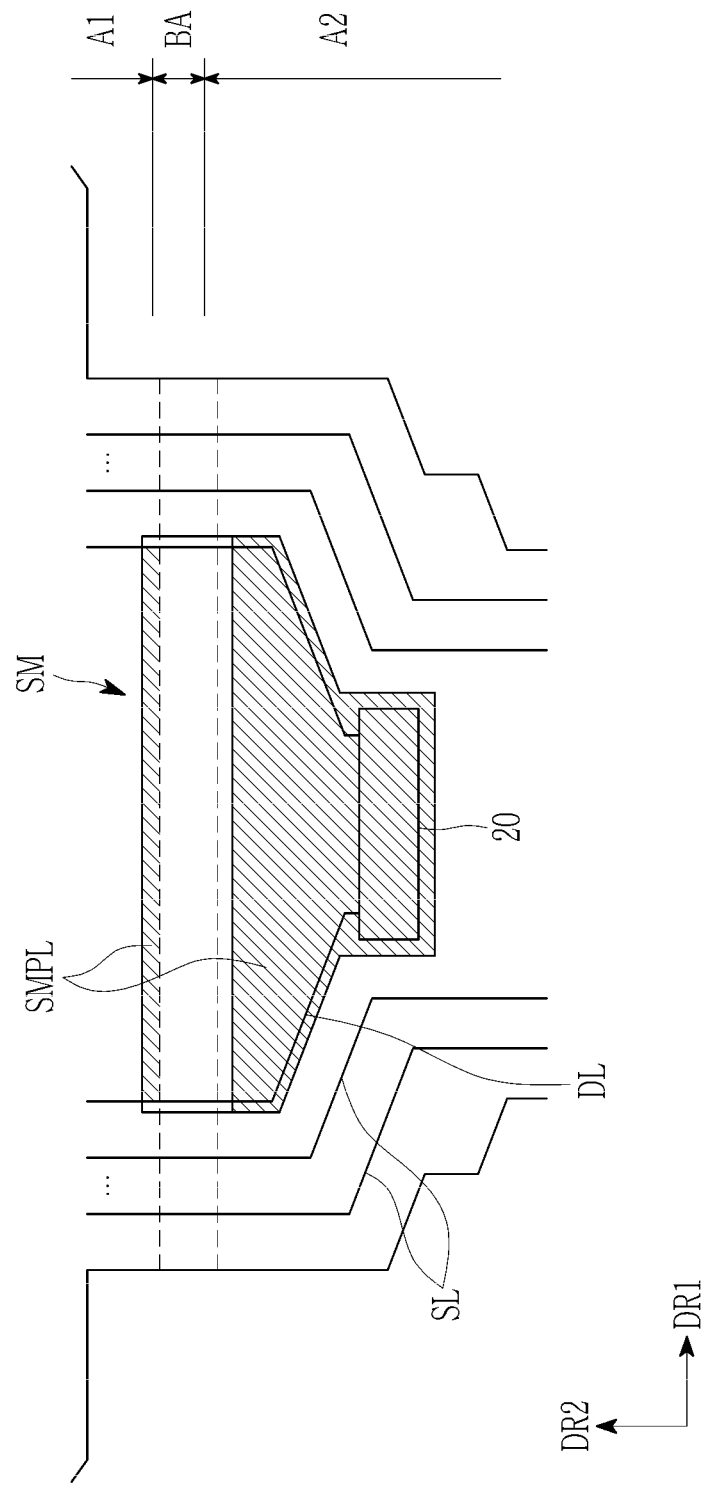
FIG. 7 shows a top plan view of a region of a display device according to an embodiment.

FIG. 7 shows a top plan view of a region of a display device according to an embodiment.

As shown in FIG. 7, the display device may include a substrate 110 and a support member SM positioned on the substrate 110. The support member SM may be positioned in the peripheral area PA and may overlap the driver. For example, the support member SM may overlap the driving circuit chip 20 and the data signal transmitting line DL connected to the driving circuit chip 20. The support member SM may be positioned in the second area A2 and may be positioned in the bending area BA and the first area A1.

In the embodiment described with reference to FIGS. 1 to 6, the support member SM may be positioned to cover the driving circuit chip 20 and the data signal transmitting line DL disposed near the same, but in the present embodiment, the support member SM may further extend in the first direction DR1 to cover the data signal transmitting line DL. The support member SM may gradually have a larger width in the second area A2 as it approaches the bending area BA. A width of the support member SM positioned in the second area A2 disposed near the bending area BA may be similar to a width of the support member SM positioned in the bending area BA and the first area A1. However, the planar shape of the support member SM is not limited thereto and may be modified in many ways. For example, the support member SM may further extend in the first direction DR1 and may reach a right end portion of the peripheral area from a left end portion thereof.

The support member SM may be a stack of a plurality of layers and may include a support member pattern layer SMPL as one of the various layers. FIG. 7 shows the position where the support member pattern layer SMPL is formed, and the shape of the support member pattern layer SMPL in a plan view may be like those described with reference to FIGS. 4 to 6. The support member pattern SMPL may be positioned in part of the region in which the support member SM is formed. The support member pattern layer SMPL may be positioned in the first area A1 and the second area A2 but may not be positioned in the bending area BA.

As described above, the support member pattern layer SMPL may be positioned on a same layer as the pixel defining layer positioned in the display area, and the support member pattern layer 540 has a similar density to the pixel defining layer 350, thereby preventing the pixel defining layer from being over-developed in the display area. By uniformly developing the pixel defining layer in the display area, the thickness is formed to be uniform, and external stains may be prevented.

While this disclosure has been described in connection with what is presently considered to be practical embodiments, it is to be understood that the present disclosure is not limited to the disclosed embodiments but is intended to cover various modifications and equivalent arrangements included within the spirit and scope of the appended claims and their equivalents.

DESCRIPTION OF SOME REFERENCE NUMERALS

20: driving circuit chip
110: substrate
TFT: transistor
191: pixel electrode
270: common electrode
350: pixel defining layer
351: pixel opening
370: emission layer
SM, 500: support member
SMPL, 540: support member pattern layer
541: opening

What is claimed is:

1. A display device comprising:
a substrate having a display area and a peripheral area at a side of the display area;
a transistor in the display area of the substrate;
a first electrode connected to the transistor;
a pixel defining layer on the first electrode and having a plurality of pixel openings;
an emission layer in respective ones of the pixel openings;
a second electrode on the emission layer and the pixel defining layer;
a driver in the peripheral area of the substrate; and
a support member overlapping the driver, the support member comprising a support member pattern layer on a same layer as the pixel defining layer and having repeated patterns.

2. The display device of claim 1, wherein the support member pattern layer has a plurality of openings that are repeatedly arranged.

3. The display device of claim 2, wherein density of a plurality of openings in the support member pattern layer is equivalent to density of a plurality of pixel openings in the pixel defining layer.

4. The display device of claim 3, wherein widths of the openings in the support member pattern layer correspond to widths of the pixel openings in the pixel defining layer.

5. The display device of claim 3, wherein a width of the support member pattern layer corresponds to a width of the pixel defining layer.

6. The display device of claim 3, wherein a distance between adjacent openings from among the openings in the support member pattern layer corresponds to a distance between adjacent pixel openings from among the pixel openings in the pixel defining layer.

7. The display device of claim 2, wherein a shape of the openings in a plan view is circular or polygonal.

8. The display device of claim 2, wherein the openings are arranged in a row direction and a column direction.

9. The display device of claim 1, wherein the support member pattern layer comprises a plurality of pattern pieces that are repeatedly arranged.

10. The display device of claim 1, wherein the pixel defining layer comprises a light blocking material.

11. The display device of claim 1, wherein the support member further comprises a plurality of organic insulating material layers.

12. The display device of claim 11, wherein the organic insulating material layers are a continuous plate shape, and the support member pattern layer is not a continuous plate shape.

13. The display device of claim 11, wherein the support member comprises:
a first organic material layer;
a second organic material layer on the first organic material layer;
a third organic material layer on the second organic material layer; and a fourth organic material layer on the third organic material layer, and wherein the support member pattern layer is between the third organic material layer and the fourth organic material layer.

14. The display device of claim 13, further comprising:

a first passivation layer on the transistor and on a same layer as the first organic material layer;

a second passivation layer on the first passivation layer and on a same layer as the second organic material layer;

a third passivation layer on the second passivation layer and on a same layer as the third organic material layer; and a spacer on the pixel defining layer and on a same layer as the fourth organic material layer.

15. The display device of claim 14, wherein the first electrode is on the third passivation layer.

16. The display device of claim 14, further comprising a connection electrode between the first passivation layer and the second passivation layer, wherein the connection electrode connects between the transistor and the first electrode.

17. The display device of claim 1, wherein the driver comprises a driving circuit chip.

18. The display device of claim 17, further comprising a data signal transmitting line connected to the driving circuit chip and configured to transmit a data signal, wherein the support member covers the driving circuit chip and the data signal transmitting line.

19. The display device of claim 18, wherein the peripheral area has:

a first area surrounding a periphery of the display area;

a second area spaced from a one-side edge of the first area; and a bending area between the first area and the second area, and wherein the driving circuit chip is in the second area.

20. The display device of claim 19, wherein the support member pattern layer is in the first area and the second area and is not in the bending area.

* * * * *